United States Patent
Fu et al.

(10) Patent No.: US 10,373,936 B2
(45) Date of Patent: Aug. 6, 2019

(54) PIXEL ELEMENTS INCLUDING LIGHT EMITTERS OF VARIABLE HEIGHTS

(71) Applicant: Facebook Technologies, LLC, Menlo Park, CA (US)

(72) Inventors: Yijing Fu, Redmond, WA (US); Wanli Chi, Sammamish, WA (US); Patrick Joseph Hughes, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 161 days.

(21) Appl. No.: 15/683,183

(22) Filed: Aug. 22, 2017

(65) Prior Publication Data

US 2019/0067254 A1  Feb. 28, 2019

(51) Int. Cl.
| | | |
|---|---|---|
| G02B 27/01 | (2006.01) | |
| G02B 3/02 | (2006.01) | |
| G06F 1/16 | (2006.01) | |
| G02B 27/00 | (2006.01) | |
| H01L 25/075 | (2006.01) | |
| H04N 13/344 | (2018.01) | |

(52) U.S. Cl.
CPC ...... *H01L 25/0753* (2013.01); *G02B 27/0025* (2013.01); *G02B 27/0172* (2013.01); *G06F 1/163* (2013.01); *H04N 13/344* (2018.05); *G02B 3/02* (2013.01)

(58) Field of Classification Search
CPC .... G06F 1/163; H04N 13/344; G02B 27/017; G02B 27/0172; G02B 27/01; G02B 3/08; G02B 27/0025; H01L 2224/1403; H01L 2224/1703; H01L 27/15; H01L 29/06; H01L 31/0328; H01L 31/109; H01L 25/0753; G02F 1/1333
See application file for complete search history.

(56) References Cited

U.S. PATENT DOCUMENTS

| | | |
|---|---|---|
| 9,429,756 B1 | 8/2016 | Cakmakci et al. |
| 2003/0197816 A1 | 10/2003 | Winer |
| 2004/0150003 A1 | 8/2004 | Ramdani et al. |
| 2007/0297750 A1 | 12/2007 | Bass et al. |
| 2010/0091031 A1 | 4/2010 | Tsujimoto |
| 2012/0299002 A1 | 11/2012 | Kinoshita |

(Continued)

FOREIGN PATENT DOCUMENTS

WO    WO 2018/222688 A1    12/2018

OTHER PUBLICATIONS

PCT International Search Report and Written Opinion, PCT Application No. PCT/US2018/046084, dated Dec. 3, 2018, 24 pages.

(Continued)

*Primary Examiner* — Laurence J Lee (74) *Attorney, Agent, or Firm* — Fenwick & West LLP (57) ABSTRACT

A head-mounted display (HMD) presents viewable media to a user. The HMD includes a light source and an optical block. The light source includes a first sub-pixel mounted on a first set of microbumps at a first height from a substrate and emits light within a first optical band, and a second sub-pixel mounted on a second set of microbumps at a second height from the substrate that is different from the first height, and emits light over a second optical band that is different than the first optical band. The optical block receives the image light from the light source, and directs the image light to an eyebox, wherein the first height and the second height mitigates longitudinal chromatic aberration and field curvature in the optical block.

18 Claims, 7 Drawing Sheets

(56) References Cited

U.S. PATENT DOCUMENTS

2013/0292831 A1  11/2013  Liu et al.
2016/0070104 A1   3/2016  Yang
2016/0268551 A1   9/2016  Shen et al.
2017/0139211 A1   5/2017  Trail

OTHER PUBLICATIONS

European Extended Search Report, European Application No. 18189101.1, dated Jan. 25, 2019, 6 pages.

PIXEL ELEMENTS INCLUDING LIGHT EMITTERS OF VARIABLE HEIGHTS

BACKGROUND

The disclosure relates generally to head-mounted-display (HMD) systems, and more specifically to manufacturing micropixels of variable height in an electronic display of the HMD system.

A head-mounted display (HMD) presents a viewable media to a user. Conventional HMDs generally have a display element that generates image light that passes through an optical system before reaching the user's eyes. In conventional optical systems, each of the pixels are on a same planar surface of the display element. Such planar configurations of pixels in conventional HMDs often result in optical distortion (e.g. chromatic aberration, field curvature) in content presented to the user.

SUMMARY

A head-mounted display (HMD) presents a viewable media to a user. The HMD includes a light source and an optical block. The light source includes a first sub-pixel, and a second sub-pixel. The first sub-pixel is mounted on a first set of microbumps at a first height and the first sub-pixel emits light within a first optical band. The second sub-pixel is mounted on a second set of microbumps at a second height, and the second sub-pixel emits light over a second optical band that is different from the first optical band. The optical block receives the image light from the light source, and directs the image light to an eyebox. The first height and the second height are configured to mitigate longitudinal chromatic aberration in the optical block. The light source also corrects the field curvature of the optical block based on varying the first height and the second height. In some configurations, the light source includes a third sub-pixel mounted on a third set of microbumps at a third height from the substrate different from the second height, and the third sub-pixel emits light over a third optical band that is different than the first optical band and the second optical band. In some embodiments, each of the first sub-pixel, the second sub-pixel, and the third sub-pixel comprises a plurality of light emitting elements.

In some embodiments, the substrate can be micromachined to vary the thickness of the substrate to mitigate longitudinal chromatic aberration in the optical block. In alternate embodiments, the substrate may be deposited with one or more additive layers to achieve a threshold value of thickness of the substrate to mitigate longitudinal chromatic aberration in the optical block. In a different embodiment, the first sub-pixel includes a template layer that compensates the stress from the substrate.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

A head-mounted display (HMD) presents a viewable media to a user. The HMD includes a light source and an optical block. The light source includes a plurality of pixel elements that generate image light corresponding to the viewable media. Each pixel element includes a substrate, one or more sub-pixels, and one or more microbumps of various aspect ratios. In some configurations, each pixel element includes a substrate of a desired thickness formed by micromachining or deposition of additive layers. The light source generates different optical bands of light such as green (e.g. $\lambda=530$ nm), blue (e.g. $\lambda=470$ nm), and red (e.g. $\lambda=640$ nm). In some embodiments, some or all of the microbumps are positioned at a different height in order to mitigate longitudinal chromatic aberration, field curvature, or both.

Figure 1A:
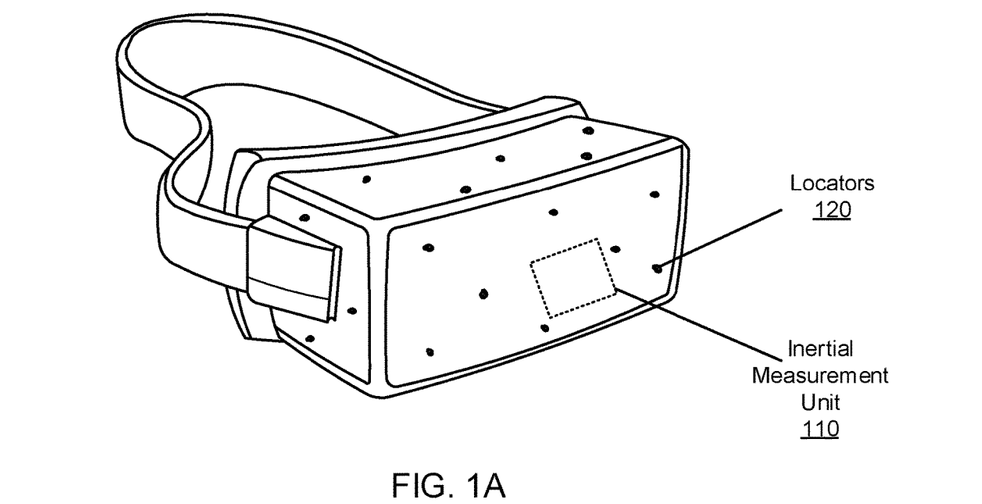
FIG. 1A is a diagram of a HMD, in accordance with at least one embodiment.

FIG. 1A is a diagram of a HMD 100, in accordance with an embodiment. The HMD 100 is a head-mounted display that presents content to a user. Example content includes images, video, audio, or some combination thereof. The HMD 100 includes display elements (not shown in FIG. 1A), an inertial measurement unit (IMU) 110, and a plurality of locators 120. The display elements include pixel elements with microbumps of various aspect ratios that mitigate the chromatic aberrations in the image light corresponding to the content presented to the user of the HMD 100, as described below in detail with reference to FIGS. 2-6.

The IMU 110 is an electronic device that generates fast calibration data based on measurement signals and generate a plurality of measurement signals in response to motion of the HMD 100. The locators 120 are objects located in specific positions on the HMD 100 relative to one another and relative to a specific reference point. Locators 120 may be a light emitting diode (LED), a corner cube reflector, a reflective marker, a type of light source that contrasts with an environment in which the HMD 100 operates, or some combination thereof.

Figure 1B:
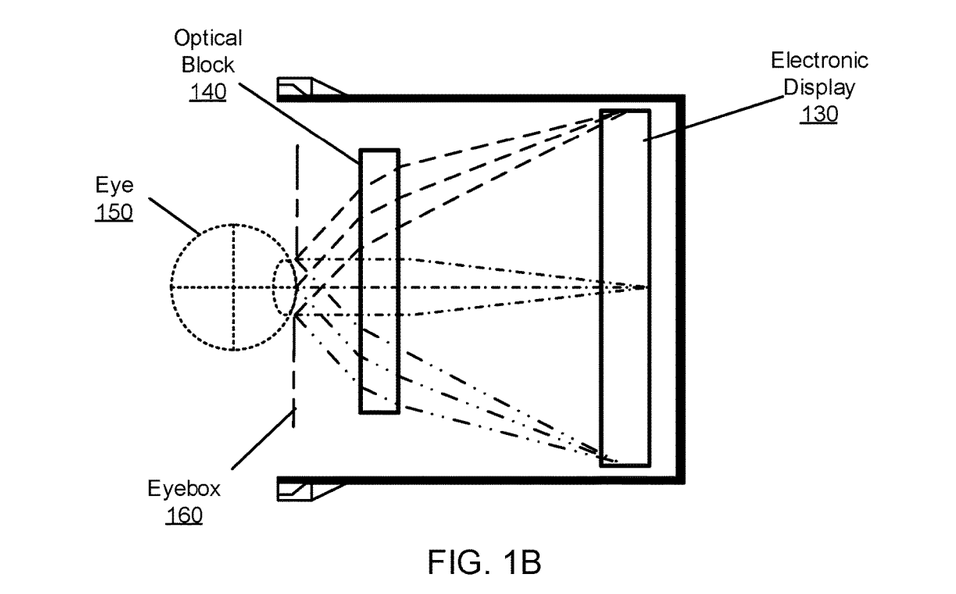
FIG. 1B is a cross section of a front rigid body of the HMD in FIG. 1A, in accordance with an embodiment.

FIG. 1B is a cross section of the HMD 100 shown in FIG. 1A. As shown in FIG. 1B, the HMD 100 includes display elements that provide image light to the eyebox 160 with mitigated chromatic aberration and field curvature. The cross-section of the HMD 100 includes an electronic display 130 and an optical block 140. For purposes of illustration, FIG. 1B shows a cross section of the HMD 100 associated with a single eye 150, but another electronic display 130, separate from the electronic display 130, provide altered image light to another eye of the user.

The electronic display 130 presents visual information (i.e., image light) from an electronic signal. The electronic display 130 includes one or more electronic display elements. An electronic display element may be, e.g., a liquid crystal display (LCD), an organic light emitting diode (OLED) display, an active-matrix organic light-emitting diode display (AMOLED), some type of flexible display, or some combination thereof. The electronic display 130 includes pixel elements of a variable height to mitigate chromatic aberration, as described below in detail with reference to FIGS. 2-5B. In some configurations, the electronic display 130 may include pixel elements of variable heights to offset the field curvature, as described below in detail with reference to FIG. 6. The optical block 140 directs an image light from the electronic display 130 to an eyebox 160. The eyebox 160 is a region of space occupied by the eye 150 of the user. The optical block 140 includes one or more optical elements composed of materials (e.g., plastic, glass, etc.) with suitable refractive indices that effectively minimize the weight of the HMD 100. The optical elements may act to, e.g., correct aberrations in image light emitted from the electronic display 130, magnify image light emitted from the electronic display 130, some other optical adjustment of image light emitted from the electronic display 130, or some combination thereof. The example for optical elements may include an aperture, a Fresnel lens, a convex lens, a concave lens, a filter, or any other suitable optical element that affects image light.

Figure 2:
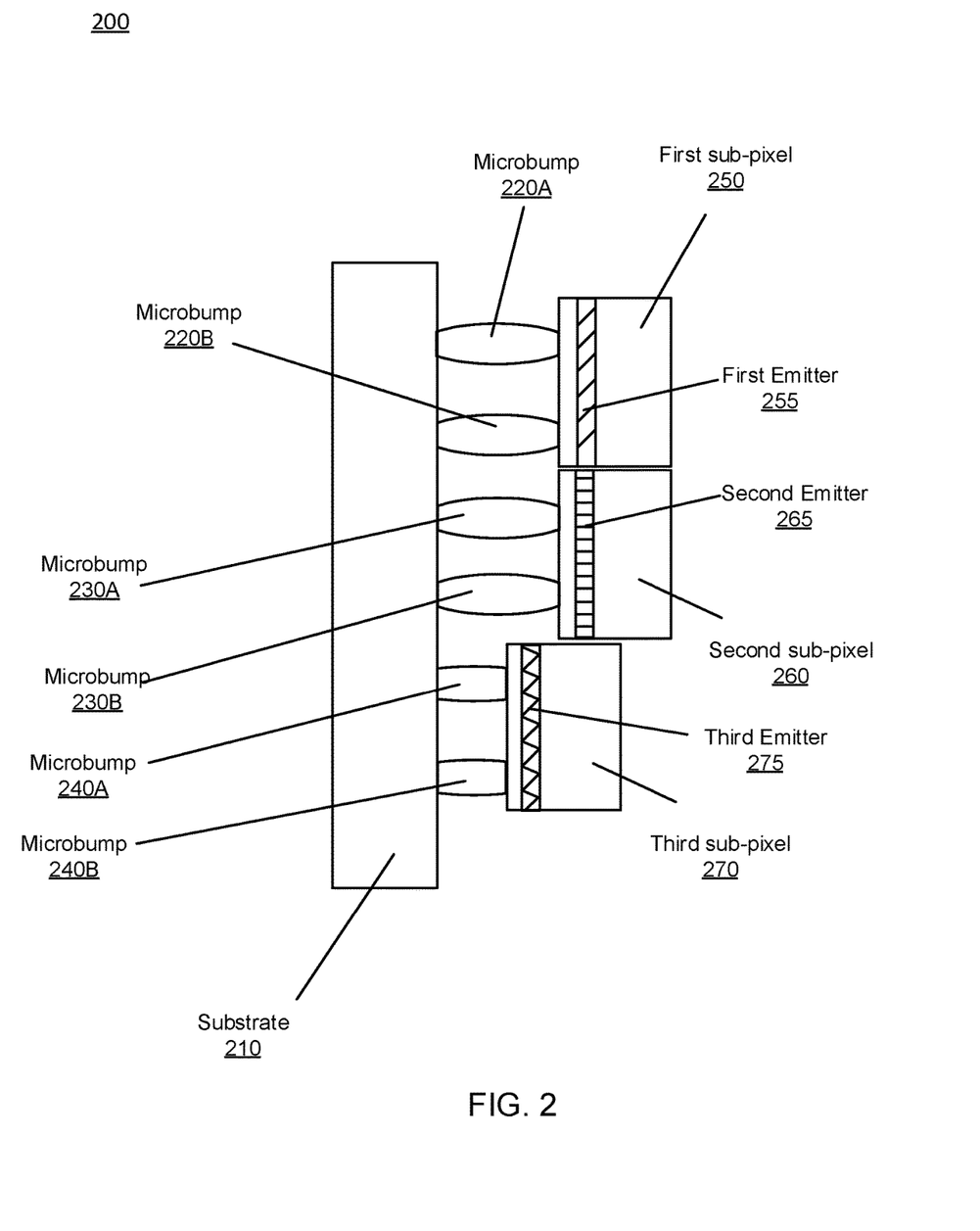
FIG. 2 is a pixel element including sub-pixels bonded onto a substrate using microbumps of different heights, in accordance with an embodiment.

FIG. 2 is a pixel element 200 including sub-pixels bonded onto a substrate 210 using a plurality of microbumps of different heights, in accordance with an embodiment.

The pixel element 200 generates image light to present viewable media to the user's eyes. The pixel element 200 includes a substrate 210, a microbump 220A, a microbump 220B, a microbump 230A, a microbump 230B, a microbump 240A, a microbump 240B, a first sub-pixel 250, a first emitter 255, a second sub-pixel 260, a second emitter 265, a third sub-pixel 270, and a third emitter 275.

The substrate 210 supports one or more physical components mounted on the substrate 210. The substrate 210 may be composed of materials including, but not restricted to, glass, plastic, metal, semiconductor wafer (e.g. silicon, gallium arsenide, gallium nitride, etc.), sapphire, or some combination thereof. In some configurations, the substrate 210 may be micromachined or etched (e.g. thinned/polished wet or dry etch, etc.) to achieve a desired thickness of the substrate 210. In alternate configurations, one or more additive layers (e.g. dielectric, photoresist, and polyimide) may be deposited on the substrate 210 to achieve a desired thickness of the substrate 210.

Each of the microbumps 220A, 220B, 230A, 230B, 240A, and 240B couples the sub-pixels (e.g., the first sub-pixel 250, the second sub-pixel 260, and the third sub-pixel 270) to the substrate 210. In some configurations, a microbump (e.g., 220A, 220B, 230A, 230B, 240A, and/or 240B) has a cylindrical shape with a variable aspect ratio manufactured by changing the pad design of the substrate or one or more deposition parameters of the method used for depositing the microbump. The shape of the microbump can be cylindrical, annular, trapezoidal or square-shaped with straight angled or rounded side profiles.

In one example, the microbump has a diameter of 3 microns and heights ranging from 3 to 6 microns. In another example, the microbump has a diameter of 5 microns and heights ranging from 5 to 10 microns. The microbump is formed by a solid state bonding of metallic alloys based on deposition methods such as electroplating, electroless deposition, sputtering, physical evaporation, or some combination thereof. The microbumps 220A, 220B, 230A, 230B, 240A, and, 240B are composed of electrically conductive materials. For example, a microbump (220A, 220B, 230A, 230B, 240A, and/or 240B) is made of metallic alloys such as CuSn—Cu, Cu—Cu, In—Au, some other electrically conductive material, or some combination thereof.

The first sub-pixel 250 is a light emitting element that emits a light of a first optical band. In some configurations, the first sub-pixel 250 is made of GaAs-based heterostructures that emit a red colored light (e.g. $\lambda$=640 nm). The first sub-pixel 250 is mounted on the substrate 210 by the microbump 220. In one example, the first sub-pixel 250 is mounted on an n-type GaAs substrate of a specific crystal orientation (e.g. 6° off towards the <111> plane). The first emitter 255 is an active region of the first sub-pixel 250 that generates the light of the first optical band. In one example, the first emitter 255 includes a plurality of quantum well structures (e.g. GaInP/AlGaInP) with a threshold value of thickness (e.g. 10 nm) for each of the quantum wells. The first sub-pixel 250 includes a plurality of light emitting elements.

The second sub-pixel 260 is a light emitting element that emits a light of a second optical band. In some configurations, the first sub-pixel 250 is made of GaN-based heterostructures that emit a green colored light (e.g. $\lambda$=530 nm). The second sub-pixel 260 is mounted on the substrate 210 by the microbump 230. In one example, the second sub-pixel 260 is mounted on a Sapphire substrate. The second emitter 265 is an active region of the second sub-pixel 260 that generates the light of the second optical band. In one example, the second emitter 265 includes a plurality of quantum well structures (e.g. InGaN/GaN) with a threshold value of thickness (e.g. 10 nm) for each of the quantum wells. The second sub-pixel 260 includes a plurality of light emitting elements.

The third sub-pixel 270 is a light emitting element that emits a light of a third optical band. In some configurations, the third sub-pixel 270 is made of GaN-based heterostructures that emit a blue colored light (e.g. $\lambda$=470 nm). The third sub-pixel 270 is mounted on the substrate 210 by the microbump 240. In one example, the third sub-pixel 270 is mounted on a Sapphire substrate. The third emitter 275 is an active region of the third sub-pixel 270 that generates the light of the third optical band. In one example, the third emitter 275 includes a plurality of quantum well structures (e.g. InGaN/GaN) with a threshold value of thickness (e.g. 10 nm) for each of the quantum wells. The third sub-pixel 270 includes a plurality of light emitting elements.

In some configurations, the third sub-pixel 270 is mounted at a relatively lower height (e.g. 11 microns) when compared to the first sub-pixel 250 and the second sub-pixel 260. Such a configuration takes into account the relative distance of each of the light emitting elements from the optical block 140. A conventional pixel element generally has all its sub-pixels mounted at a same height. In contrast, the pixel element 200 has the third sub-pixel 270 which emits light at a shorter wavelength than light from, e.g., the first sub-pixel 250. This difference in height acts to mitigate chromatic aberration that would otherwise occur as light from each of the sub-pixels propagates through an optical system. In one example, the microbump 220A has a height of 7-10 microns, the microbump 230A has a height in the range of 7 to 10 microns, and the microbump 240A has a height of 0 microns. The height difference between each of the three microbumps 220A, 230A, and 240A is more relevant than the absolute height of each of the microbumps. In one design, the height difference between the three microbumps 220A, 230A, and 240A can range from 7 to 11 microns.

In some embodiments, the pixel element 200 includes one or more sub-pixels. Each of the one or more sub-pixels may be mounted at different heights. For example, the pixel element 200 may include five sub-pixels and at least two of the five sub-pixels may be mounted at two different heights. In some embodiments, each sub-pixel is mounted at height based on what wavelength of light is emitted by the sub-pixel. For example, a sub-pixel that emits red light may be mounted at a first height, a sub-pixel that emits green light is mounted at a second height that is less than the first height, and a sub-pixel that emits blue light is mounted at a third height that is less than the second height.

Figure 3:
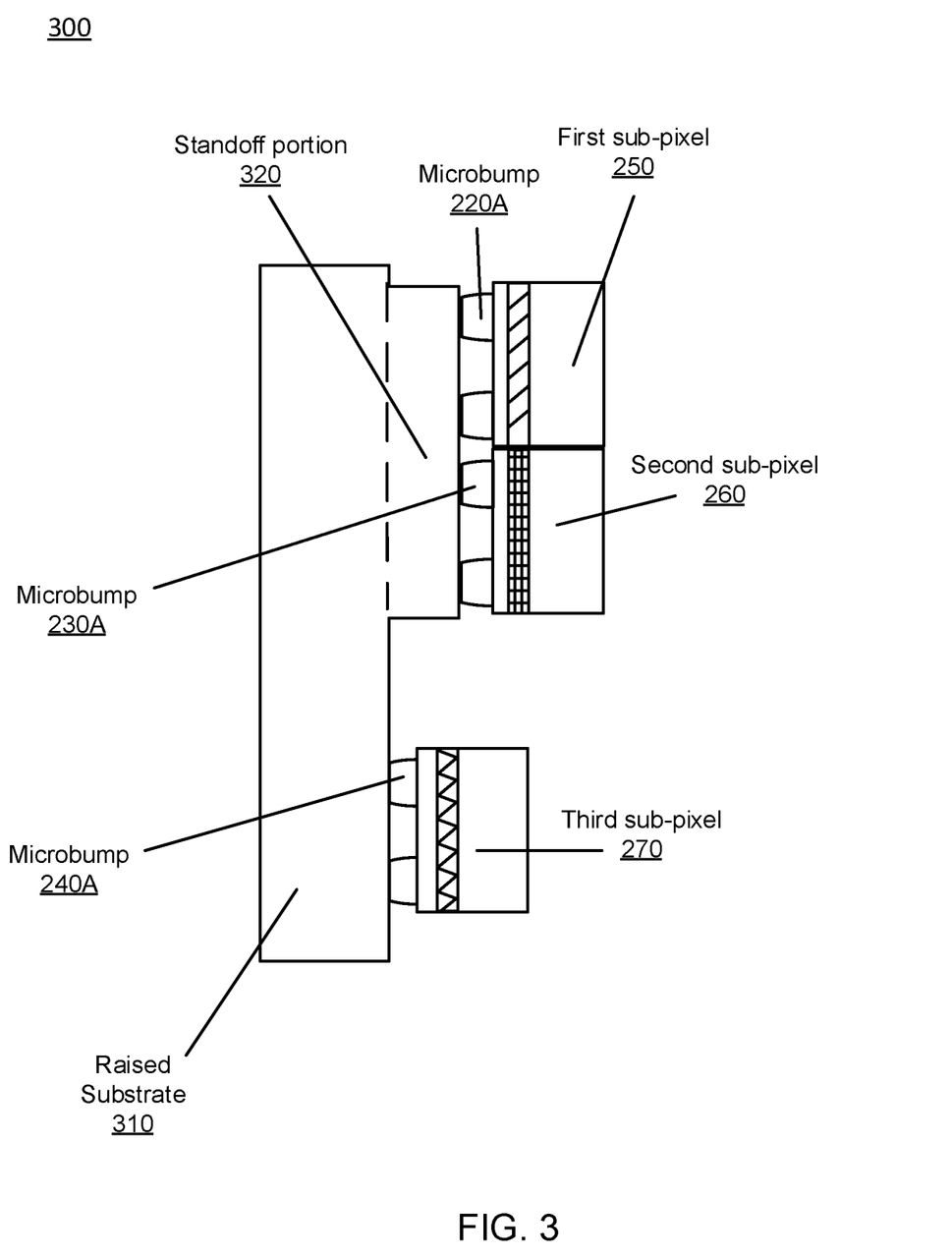
FIG. 3 is a pixel element including sub-pixels bonded on a raised substrate using high aspect ratio microbumps, in accordance with an embodiment.

FIG. 3 is a pixel element 300 including sub-pixels bonded on a raised substrate using aspect ratio microbumps, in accordance with an embodiment. The pixel element 300 generates image light to present viewable media to the user's eyes. The pixel element 300 includes a raised substrate 310, the microbump 220A, the microbump 220B, the microbump 230A, the microbump 230B, the microbump 240A, the microbump 240B, the first sub-pixel 250, the second sub-pixel 260, and the third sub-pixel 270.

The raised substrate 310 supports one or more physical components mounted on different portions of the raised substrate 310. The raised substrate 310 is composed of materials including, but not restricted to, glass, plastic, metal, semiconductor wafer (e.g. silicon, gallium arsenide, gallium nitride, etc.), sapphire, or some combination thereof. In some configurations, the raised substrate 310 may be micromachined or etched (e.g. laser lift-off, wet etch, etc.) at different locations to achieve one or more desired thickness at different portions of the raised substrate 310. The raised substrate 310 includes a standoff portion 320 with a thickness in the range of 0 to 11 microns. The standoff portion 320 mounts at least one sub-pixel at a specific height relative to the thickness of the raised substrate 310. In the embodiment of FIG. 3, the standoff portion 320 mounts the first sub-pixel 250 and the second sub-pixel 260 at the same height relative to the thickness of the raised substrate 310. In alternate configurations, the first sub-pixel 250 may be mounted at a first standoff portion (not shown here) and the second sub-pixel 260 may be mounted at a second standoff portion (not shown here) in order to adjust the position of a sub-pixel relative to the distance from an optical surface.

In the embodiment of FIG. 3, the first sub-pixel 250 and the second sub-pixel 260 are mounted at a first height using the microbump 220A and the microbump 230A, while the third sub-pixel 270 is mounted at a second height using the microbump 240A on the raised substrate 310. In a different embodiment, the first sub-pixel 250 is mounted at a first height using the microbump 220A and the second sub-pixel is mounted at a second height using the microbump 230A. For example, the first height is at least 10 microns and the second height is at least 10 microns. The first sub-pixel 250 and the second sub-pixel 260 have a pitch in the range of 0 to 1 micron.

In alternate embodiments, one or more additive layers (e.g. dielectric, photoresist, and polyimide) may be deposited on the raised substrate 310 to achieve a desired thickness of the standoff portion 320. In one example, the standoff portion 320 has a thickness in the range of 0 to 20 microns. When compared to micromachining the substrate 210 of FIG. 2 to achieve the standoff portion 320 of a specific height, deposition of additive layers on the raised substrate 310 achieves the standoff portion 320 of a precise value of thickness and better uniformity of thickness across the standoff portion 320 suitable for high volume manufacturing purposes.

In some embodiments, the pixel element 300 includes one or more sub-pixels. Each of the one or more sub-pixels may be mounted at different heights. For example, the pixel element 300 may include five sub-pixels and at least two of the five sub-pixels may be mounted at two different heights.

The pixel element 300 of FIG. 3 is only an example embodiment of a pixel element, and several other variations are possible, using a combination of the pixel element 200 of FIG. 2 and the pixel element 300 of FIG. 3 that are not explicitly shown here so as not to unnecessarily obscure aspects of the embodiments.

Figure 4:
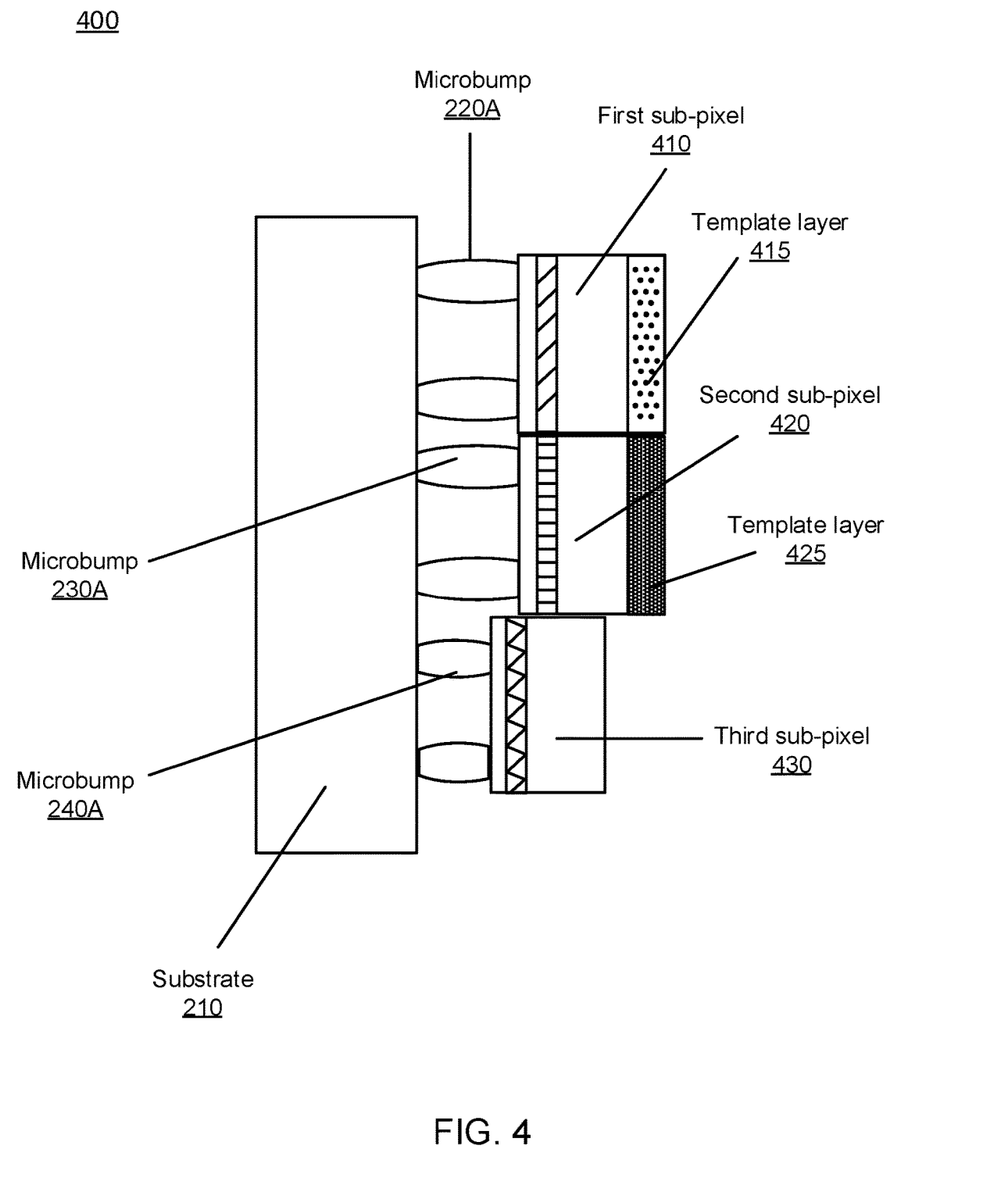
FIG. 4 is a pixel element including sub-pixels bonded on a substrate using microbumps of differing aspect ratios and template layers on the subpixels, in accordance with an embodiment.

FIG. 4 is a pixel element 400 including sub-pixels bonded on a substrate 210 using microbumps of differing aspect ratios and template layers on the subpixels, in accordance with an embodiment.

The pixel element 400 generates image light to present a viewable media to the user's eyes. The pixel element 400 includes the substrate 210, the microbump 220A, the microbump 220B, the microbump 230A, the microbump 230B, the microbump 240A, the microbump 240B, a first sub-pixel 410, a template layer 415, a second sub-pixel 420, a template layer 425, and a third sub-pixel 430. The substrate 210 may include one or more non-transparent layers that are removed by processes including, but not restricted to, laser lift-off, wet chemical etching, and some combination thereof.

The first sub-pixel 410 is a light emitting element that emits light of a first optical band. In some configurations, the first sub-pixel 410 is made of GaAs-based heterostructures that emit a red colored light (e.g. $\lambda$=640 nm). The first sub-pixel 410 is mounted on the substrate 210 by the microbump 220. The first sub-pixel 410 is similar to the first sub-pixel 250 of FIG. 2 except for the presence of a template layer 415.

The template layer 415 is an additional transparent layer added during the growth of the first sub-pixel 410 to compensate for the stress due to lattice mismatch with the substrate 210. The template layer 415 is an undoped epitaxial layer selected from a group consisting of: Aluminum Nitride (AlN), Aluminum gallium Nitride (AlGaN), Indium Gallium Nitride (InGaN), Gallium Nitride (GaN), Indium Gallium Arsenide (InGaAs), Indium Gallium Phosphide (InGaP), and some combination thereof. The template layer 415 can also include one or more non-epitaxial layers which are added after growing the first sub-pixel 410. For example, the non-epitaxial layer may include elayers used for our micro assembly processes. The elayers are transparent materials typically made from PDMS (Polydimethylsiloxane). Other options for the elayers include Silicone gel (e.g. Wacker Semicosil 915HT—UV curable, heat resistant up to 210° C.), Silopren (e.g. Ultra Clear Silopren LSR 7000) or PI (Polyimide, e.g. Essar Stretch—a type of Polyimide that exhibit optical clarity and temperature stability up to 300° C.). They can be molded into shapes at microscale and have good adhesive properties. In some configurations, the template layer 415 is an undoped buffer layer of a threshold value of thickness added during the growth of the first sub-pixel 410. For example, the threshold value of thickness of the template layer 415 is in the range of 0.1 micron to four microns.

The second sub-pixel 420 is a light emitting element that emits a light of a second optical band. In some configurations, the second sub-pixel 420 is made of GaN-based heterostructures that emit a green colored light (e.g. λ=530 nm). The second sub-pixel 420 is mounted on the substrate 210 by the microbump 230. The third sub-pixel 430 is similar to the second sub-pixel 260 of FIG. 2 except for the presence of a template layer 425.

The template layer 425 is an embodiment of the template layer 415. In some configurations, the template layer 425 is an undoped buffer layer of a threshold value of thickness added during the growth of the second sub-pixel 420. For example, the threshold value of thickness of the template layer 425 is in the range of 0.1 micron to 4 microns.

The third sub-pixel 430 is a light emitting element that emits a light of a third optical band. In some configurations, the third sub-pixel 430 includes an undoped buffer layer (not shown here) of a threshold value of thickness added during the growth of the third sub-pixel 430. For example, the threshold value of thickness is in the range of 0.1 micron to 4 microns.

When compared to the embodiments of the pixel element 200 of FIG. 2 and the pixel element 300 of FIG. 3, the pixel element 400 minimizes the use of high aspect ratio microbumps and also avoids any interference of the pickup head during the placement of the third sub-pixel 430. The pickup head picks up each of the sub-pixels and place the sub-pixels onto the substrate 210. Typically, the pickup head is large and involves getting access or clearance for the placement of sub-pixels. The placement of the third sub-pixel 430 is done first before the placement of the first sub-pixel 410 and the second sub-pixel 420. If not done first, the pickup head will be restricted to access and place the third sub-pixel 430 at the correct placement location because of interference by the neighboring second sub-pixel 420. The template layer 415 minimizes the possibility of interference without the raised substrate 310 of the pixel element 300 of FIG. 3 and/or the significant difference in aspect ratios of the pixel element 200 of FIG. 2.

In alternate embodiments, the pixel element 400 includes one or more sub-pixels. Each of the one or more sub-pixels can be mounted at different heights. For example, the pixel element 400 may include five sub-pixels and at least two of the five sub-pixels may be mounted at two different heights.

The pixel element 400 of FIG. 4 is only an example embodiment of a pixel element, and several other variations are possible, using a combination of the pixel element 200 of FIG. 2, the pixel element 300 of FIG. 3, and the pixel element 400 of FIG. 4 that are not explicitly shown here so as not to unnecessarily obscure aspects of the embodiments. For example, the first sub-pixel 250 of the pixel element 200 may include the template layer 415 of FIG. 4 and the first sub-pixel 250 may be mounted on the standoff portion 320 of the raised substrate 310 of FIG. 3.

Figure 5A:
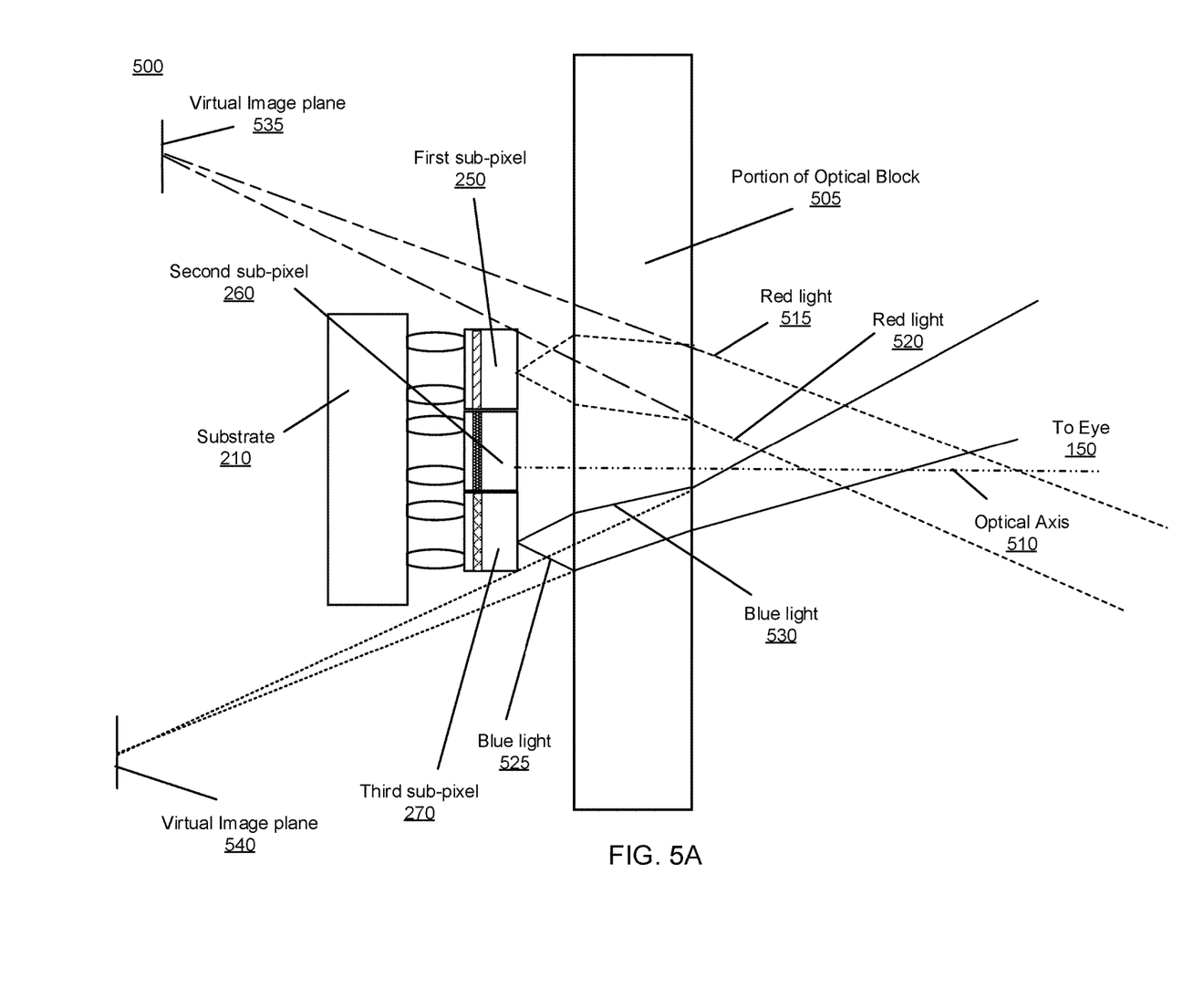
FIG. 5A is illustrates Longitudinal Chromatic Aberration (LCA) in a portion of the HMD in FIG. 1A, in accordance with an embodiment.

FIG. 5A is illustrates Longitudinal Chromatic Aberration (LCA) in a portion 500 of the HMD of FIG. 1A, in accordance with an embodiment.

The portion 500 includes a portion of the optical block 505, the substrate 210, the first sub-pixel 250, the second sub-pixel 260, and the third sub-pixel 270. The portion of the optical block 505 is an embodiment of the optical block 140, as described above in conjunction with FIG. 1. The optical block 505 includes an optical axis 510.

As shown in FIG. 5A, each of the first sub-pixel 250, the second sub-pixel 260, and the third sub-pixel 270 is mounted on the substrate 210. The first sub-pixel 250 emits red light 515 and red light 520 toward the portion of the optical block 505. The portion of the optical block 505 directs the red light 515 and the red light 520 with a significant divergence such that the user's eye 150 would see a viewable media corresponding to the red light 515 and the red light 520 at a virtual image plane 535. The third sub-pixel 270 emits blue light 525 and blue light 530 toward the portion of the optical block 505. The portion of the optical block 505 directs the blue light 525 and the blue light 530 with a significant divergence such that the user's eye 150 would see a viewable media corresponding to the blue light 525 and the blue light 530 at a virtual image plane 540. The difference in relative positions of the virtual image plane 535 and the virtual image plane 540 with reference to the optical axis 510 results in a longitudinal chromatic aberration when presented to the user's eye 150.

Figure 5B:
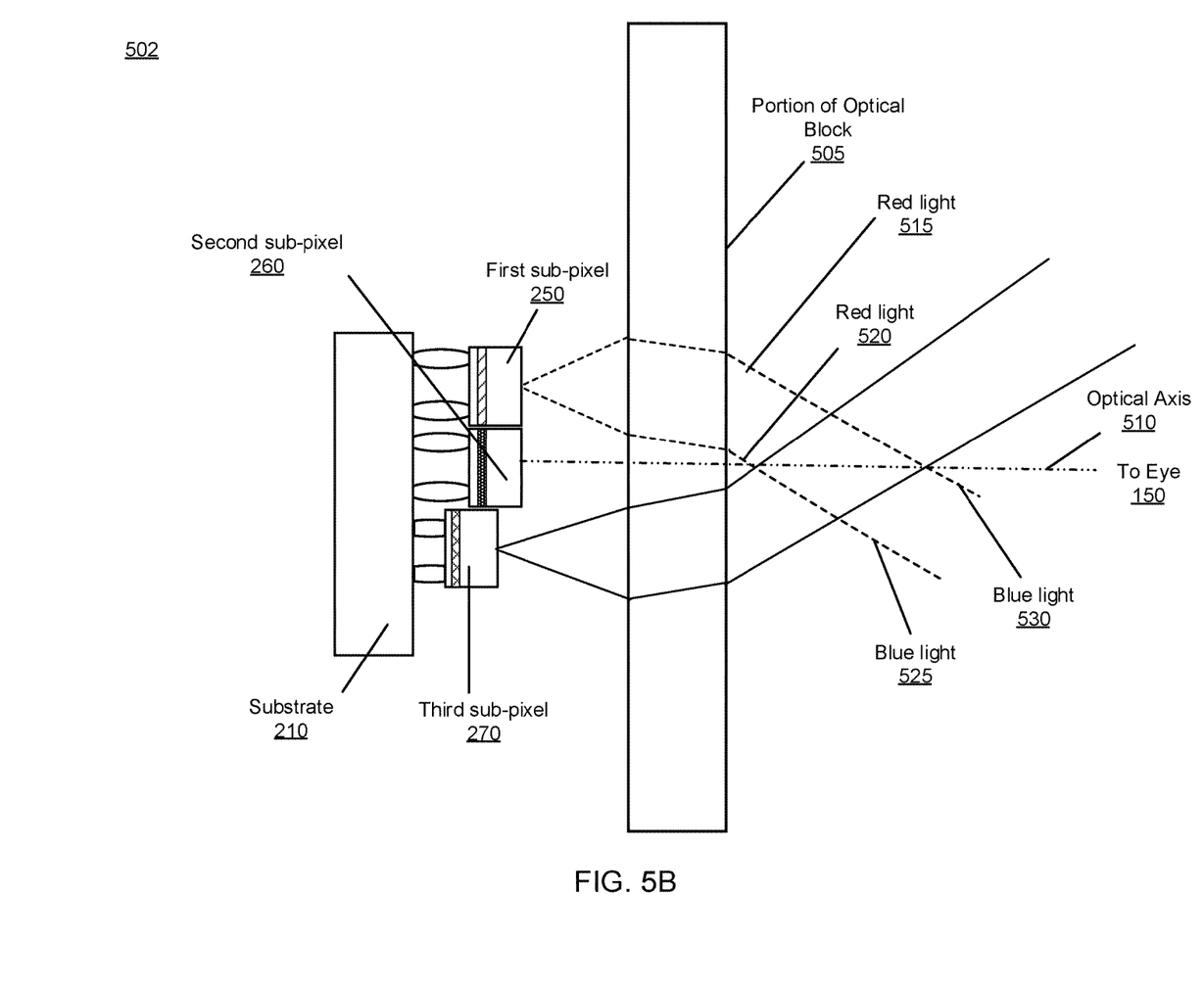
FIG. 5B illustrates a portion of the HMD in FIG. 1A configured to mitigate Longitudinal Chromatic Aberration (LCA), in accordance with an embodiment.

FIG. 5B illustrates a portion 502 of the HMD in FIG. 1A configured to mitigate Longitudinal Chromatic Aberration (LCA), in accordance with an embodiment.

The portion 502 includes the first sub-pixel 250, the second sub-pixel 260, and the third sub-pixel 270 of the pixel element 200. In some configurations, the portion 502 may include the sub-pixels of the pixel element 300 and the pixel element 400, as described above in conjunction with FIG. 3 and FIG. 4. In alternate configurations, the portion 502 may include some other pixel element that is designed to correct for LCA for at least two bands of light emitted by the display.

As shown in FIG. 5B, each of the first sub-pixel 250, the second sub-pixel 260, and the third sub-pixel 270 is mounted on the substrate 210. The first sub-pixel 250 emits a red light 515 and a red light 520 toward the portion of the optical block 505. The portion of the optical block 505 directs the red light 515 and the red light 520 as a plane wave corresponding to a virtual image plane (not shown here) formed at an infinite distance. The red light 515 and the red light 520 present the viewable media to the user's eye 150 with mitigated longitudinal chromatic aberration as the user's eye 150 interprets the viewable media as the plane wave exiting the portion 502 from an infinite distance. Note that when compared to the portion 500 of FIG. 5A, the portion 502 includes pixel elements that mitigate the LCA to few tens of microns. The third sub-pixel 270 emits a blue light 525 and a blue light 530 toward the portion of the optical block 505. The portion of the optical block 505 directs the blue light 525 and the blue light 530 to the same virtual image plane formed at an infinite distance. The blue light 525 and the blue light 530 present the viewable media to the user's eye 150 with a mitigated longitudinal chromatic aberration. Note that in the embodiment in FIG. 5B, the first sub-pixel 250 and the second sub-pixel 260 are at the same relative height, but they emit in different bands, accordingly, there may be some longitudinal chromatic aberration. However, in most cases, the amount of aberration is rather minimal between red light and green light, accordingly, in order to, e.g., simplify manufacturing and reduce costs, the first sub-pixel 250 and the second sub-pixel 260 can be placed at the same relative height. Moreover, as the eye is most sensitive to green light, in some embodiments, the distances from the substrate 210 for the first sub-pixel 250 and the third sub-pixel 270 may be set such that the corresponding virtual image planes are co-located with the virtual image plane for the green light emitted from the second sub-pixel 260.

In some embodiments, each sub-pixel that emits in particular band of light is positioned at a specific distance from the substrate 210 to mitigate chromatic aberration for all bands of light. For example, the first sub-pixel 250 emits red light and is at a first distance from the substrate 210, the second sub-pixel 260 emits green light and is at a second distance from the substrate 210 that is less than the first distance, and the third sub-pixel 270 that emits blue light is at a third distance from the substrate 210 that is less than the second distance.

Figure 6:
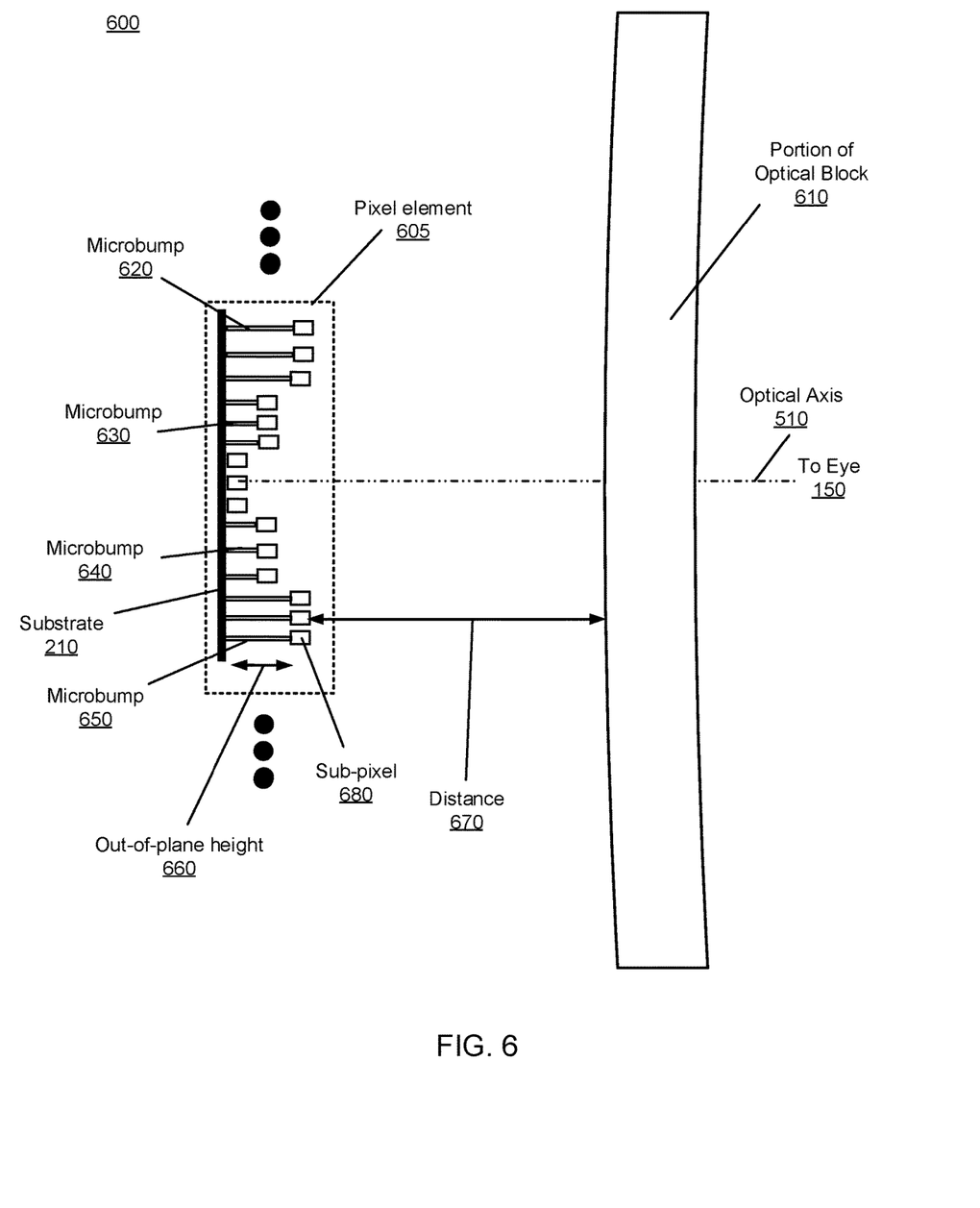
FIG. 6 a portion of the electronic display of FIG. 1B that includes a plurality of pixel elements configured to mitigate field curvature, in accordance with an embodiment.

FIG. 6 a portion 600 of the electronic display 130 of FIG. 1B that includes a plurality of pixel elements configured to mitigate field curvature, in accordance with an embodiment. The portion 600 includes a pixel element 605 and a portion of the optical block 610. The portion of the optical block 610 is an embodiment of the optical block 140, as described above with reference to FIG. 1B. The portion of the optical block 610 includes the optical axis 510, as described above with reference to FIG. 5. Each of the microbump 620, 630, 640, and 650 is an embodiment of the microbump 220A, as described above with reference to FIG. 2.

As shown in FIG. 6, each of the microbump 620, 630, 640, and 650 is associated with a different height so that the corresponding sub-pixels mounted on the microbumps are associated with a respective out-of-plane height. The out-of-plane height of each sub-pixel is a function of a distance of separation from the portion of the optical block 610. In the example of FIG. 6, the microbump 650 is associated with a specific out-of-plane height 660 (e.g. 6 microns) such that the sub-pixel 680 is separated from the portion of the optical block 610 by a distance 670. In one example, the distance 670 is in the range of 100 to 500 microns. Such relative differences between the out-of-plane heights and the distance of separation from the portion of the optical block 610 compensates for the field curvature of the portion of the optical block 610. In some configurations, the portion of the optical block 610 may include lenses with one or more rotationally asymmetric surfaces, and the pixel element 605 may include a plurality of out-of-plane heights (not shown here) to compensate for the differences in radius of curvature of such rotationally asymmetric surfaces. Such a configuration allows compensation for the field curvature of a lens in the portion of the optical block 610 by adjusting the out-of-plane height 660 of each of the corresponding sub-pixels. The embodiment of FIG. 6, simplifies the design of the portion of the optical block 610 and a relatively smaller lens of the portion of the optical block 610 can be achieved without sacrificing the quality of the viewable media presented to the user's eye 150.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A head-mounted display, comprising:
   a light source comprising a plurality of pixel elements configured to emit image light that includes at least two different optical bands of light, the light source further comprising:
      a first sub-pixel mounted on a first set of microbumps at a first height from a substrate and configured to emit light within a first optical band, and
      a second sub-pixel mounted on a second set of microbumps at a second height from the substrate that is different from the first height, and the second sub-pixel is configured to emit light over a second optical band that is different than the first optical band, each of the first sub-pixel and the second sub-pixel comprising a plurality of light emitting elements; and
   an optical block configured to receive the image light from the light source, and direct the image light to an eyebox, wherein the first height and the second height are configured to mitigate longitudinal chromatic aberration in the optical block.

2. The head-mounted display of claim 1, wherein the light source includes a third sub-pixel mounted on a third set of microbumps at a third height from the substrate different from the second height, and the third sub-pixel is configured to emit light over a third optical band that is different than the first optical band and the second optical band, the third sub-pixel comprising a plurality of light emitting elements.

3. The head-mounted display of claim 2, wherein the substrate is micromachined to a threshold value of thickness at one or more locations on the substrate to mount the third sub-pixel, the threshold value of thickness determined based on the first height and the second height to mitigate longitudinal chromatic aberration in the optical block.

4. The head-mounted display of claim 3, wherein the threshold value of thickness is achieved by depositing one or more additive layers on the substrate to form one or more standoff portions, each standoff portion mounting at least the first sub-pixel and the second sub-pixel at a fourth height different from the third height to mitigate longitudinal chromatic aberration in the optical block.

5. The head-mounted display of claim 2, wherein the third height from the substrate is different from the first height.

6. The head-mounted display of claim 1, wherein the light source includes a template layer in each of the first sub-pixel and the second sub-pixel, the template layer configured to compensate a stress due to lattice mismatch with the substrate.

7. The head-mounted display of claim 1, wherein the first set of microbumps and the second set of microbumps are associated with one or more out-of-plane heights determined based on a distance of separation from the optical block, the difference between the out-of-plane height and the distance of separation compensating for a field curvature of the optical block.

8. The head-mounted display of claim 7, wherein the first set of microbumps and the second set of microbumps are mounted on the substrate micromachined to a threshold value of thickness to mitigate longitudinal chromatic aberration in the optical block.

9. The head-mounted display of claim 7, wherein the first set of microbumps mounts the first sub-pixel including a first template layer and the second set of microbumps mounts a second sub-pixel including a second template layer different from the first template layer to mitigate longitudinal chromatic aberration in the optical block.

10. An electronic display, comprising:
a substrate;
a plurality of microbumps;
a first sub-pixel mounted on a first set of microbumps on the substrate at a first height and configured to emit light within a first optical band; and
a second sub-pixel mounted on a second set of microbumps on the substrate at a second height that is different from the first height, and the second sub-pixel is configured to emit light within a second optical band that is different than the first optical band, wherein the first height and the second height are configured to mitigate longitudinal chromatic aberration in an optical block receiving light from the electronic display, each of the first sub-pixel and the second sub-pixel comprising a plurality of light emitting elements.

11. The electronic display of claim 10, further comprising:
a third sub-pixel mounted on a third set of microbumps at a third height different from the second height, and the third sub-pixel is configured to emit light over a third optical band that is different than the first optical band and the second optical band, the third sub-pixel comprising a plurality of light emitting elements.

12. The electronic display of claim 11, wherein the substrate is micromachined to a threshold value of thickness at one or more locations on the substrate to mount the third sub-pixel, the threshold value of thickness determined based on the first height and the second height to mitigate longitudinal chromatic aberration in the optical block.

13. The electronic display of claim 12, wherein the threshold value of thickness is achieved by depositing one or more additive layers on the substrate to form one or more standoff portions, each standoff portion mounting at least the first sub-pixel and the second sub-pixel at a fourth height different from the third height.

14. The head-mounted display of claim 12, wherein the third height from the substrate is different from the first height.

15. The electronic display of claim 10, wherein the light source includes a template layer in each of the first sub-pixel and the second sub-pixel, the template layer configured to compensate a stress due to lattice mismatch with the substrate.

16. The electronic display of claim 10, wherein the first set of microbumps and the second set of microbumps are associated with one or more out-of-plane heights determined based on a distance of separation from the optical block, the difference between the out-of-plane height and the distance of separation compensating for a field curvature of the optical block.

17. The electronic display of claim 16, wherein the first set of microbumps and the second set of microbumps are mounted on the substrate micromachined to a threshold value of thickness to mitigate longitudinal chromatic aberration in the optical block.

18. The electronic display of claim 16, wherein the first set of microbumps mounts the first sub-pixel including a first template layer and the second set of microbumps mounts a second sub-pixel including a second template layer different from the first template layer to mitigate longitudinal chromatic aberration in the optical block.

* * * * *